United States Patent
Kotani

(10) Patent No.: US 7,458,057 B2
(45) Date of Patent: Nov. 25, 2008

(54) PATTERN CORRECTION METHOD, PATTERN CORRECTION SYSTEM, MASK MANUFACTURING METHOD, SEMICONDUCTOR DEVICE MANUFACTURING METHOD, RECORDING MEDIUM, AND DESIGNED PATTERN

(75) Inventor: Toshiya Kotani, Machida (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 705 days.

(21) Appl. No.: 10/882,217

(22) Filed: Jul. 2, 2004

(65) Prior Publication Data

US 2005/0031976 A1 Feb. 10, 2005

(30) Foreign Application Priority Data

Jul. 2, 2003 (JP) .............................. 2003-190341

(51) Int. Cl.
*G06F 17/50* (2006.01)
(52) U.S. Cl. .......................................... 716/21; 716/19
(58) Field of Classification Search ............. 716/19–21; 430/5, 22
See application file for complete search history.

(56) References Cited

U.S. PATENT DOCUMENTS

| 5,867,253 | A | 2/1999 | Nakae |  |
|---|---|---|---|---|
| 7,058,923 | B2 * | 6/2006 | Tounai et al. | 716/19 |
| 7,080,349 | B1 * | 7/2006 | Babcock et al. | 716/19 |
| 2004/0205688 | A1 * | 10/2004 | Pierrat | 716/21 |

FOREIGN PATENT DOCUMENTS

| JP | 8-321450 | 12/1996 |
|---|---|---|
| JP | 9-319067 | 12/1997 |
| JP | 10-104818 | 4/1998 |
| JP | 2001-92112 | 4/2001 |
| JP | 2002-131882 | 5/2002 |

OTHER PUBLICATIONS

Notification of First Office Action from the SIPO of the People's Republic of China, mailed Apr. 28, 2006, in Chinese Patent Application No. 2004-100500846, and English translation thereof.
Notification of Reasons for Rejection from the Japan Patent Office, mailed Oct. 23, 2007, in Japanese Patent Application No. 2003-190341, and English translation thereof.

* cited by examiner

*Primary Examiner*—Jack Chiang
*Assistant Examiner*—Binh C Tat
(74) *Attorney, Agent, or Firm*—Finnegan, Henderson, Farabow, Garrett & Dunner, L.L.P.

(57) ABSTRACT

According to an aspect of the invention, there is provided a pattern correction method in which a shape of a target pattern is corrected in accordance with an arrangement state between the target pattern configuring a designed pattern and a vicinity pattern disposed in the vicinity of the target pattern, the pattern correction method comprises detecting a first arrangement state between a first predetermined portion of an edge of the target pattern and the vicinity pattern, detecting a second arrangement state between a second predetermined portion of the edge of the target pattern and the vicinity pattern, determining a correction value of the edge of the target pattern based on a rule in accordance with the first and second arrangement states, and adding the correction value to the edge of the target pattern.

12 Claims, 9 Drawing Sheets

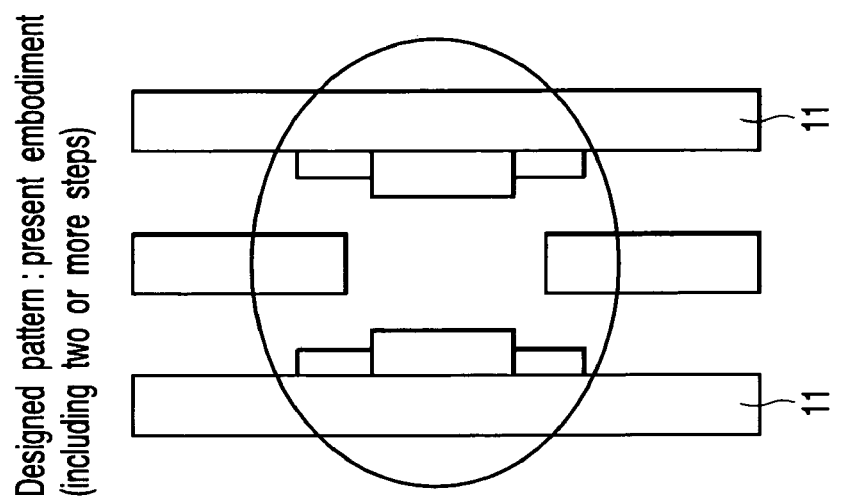
FIG. 8C Designed pattern : present embodiment (including two or more steps)
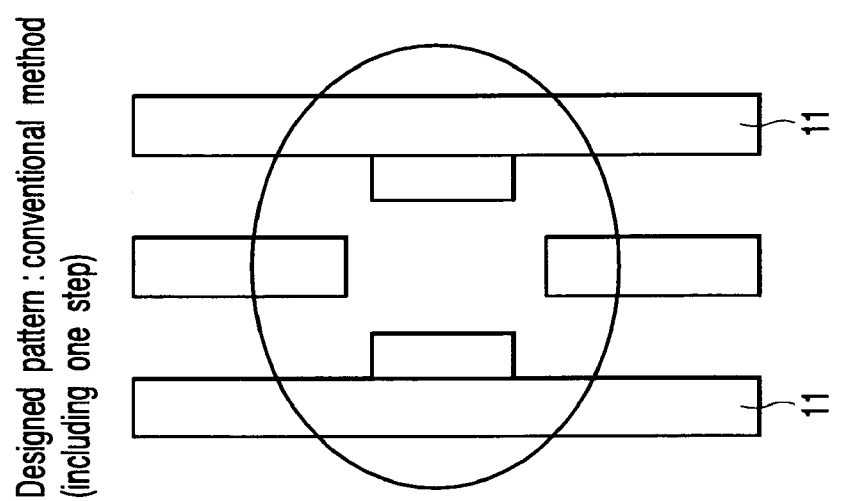
FIG. 8B Designed pattern : conventional method (including one step)
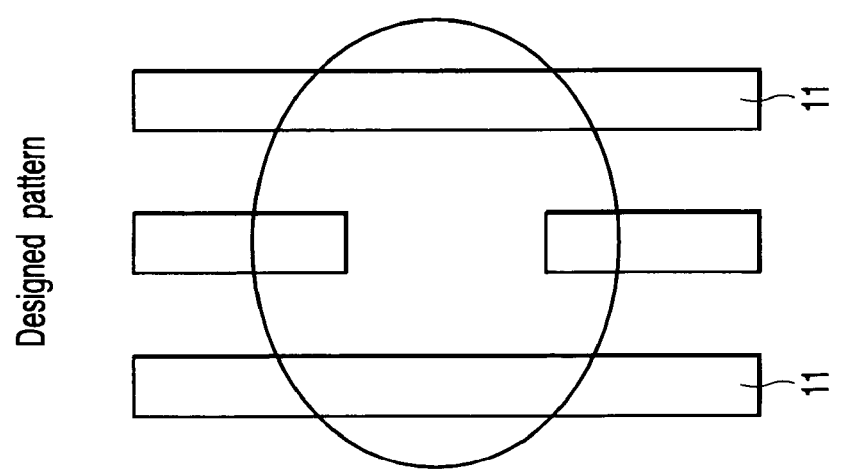
FIG. 8A Designed pattern

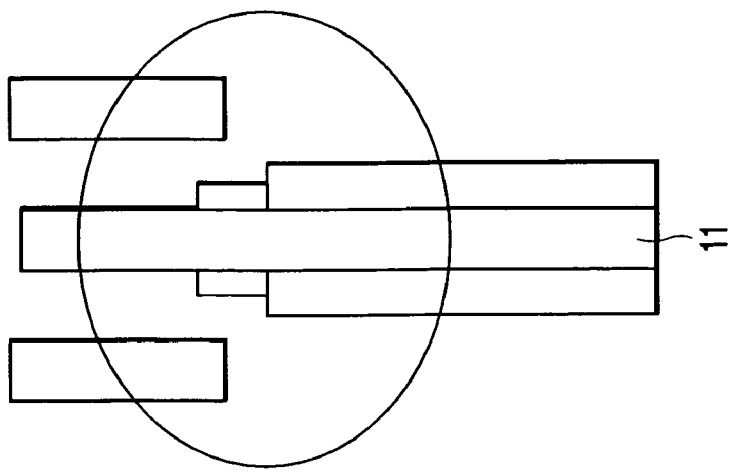
F I G. 9 C  Designed pattern : present embodiment (including two or more steps)
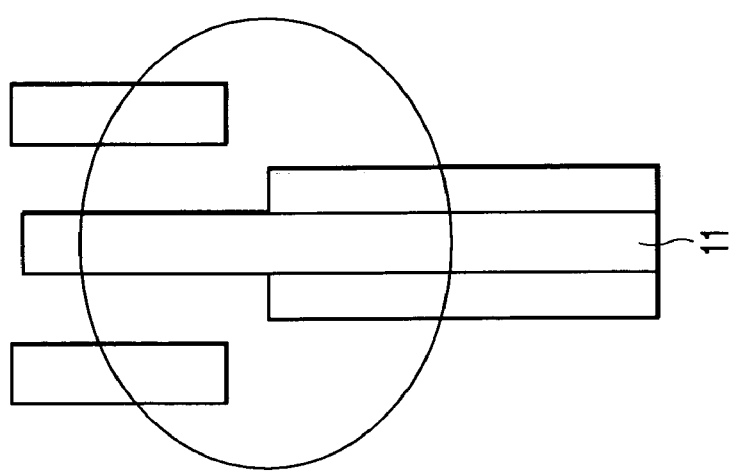
F I G. 9 B  Designed pattern : conventional method (including one step)
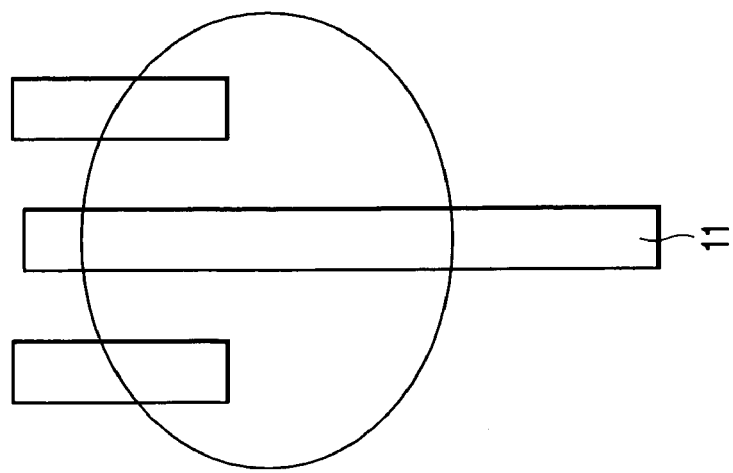
F I G. 9 A  Designed pattern Designed pattern prepared by conventional method (one step)
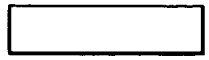
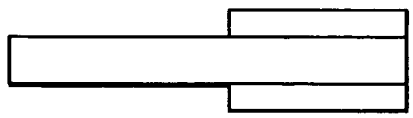
FIG. 11A
Designed pattern prepared by present embodiment (two steps)
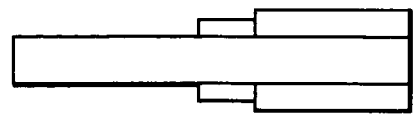
FIG. 11B
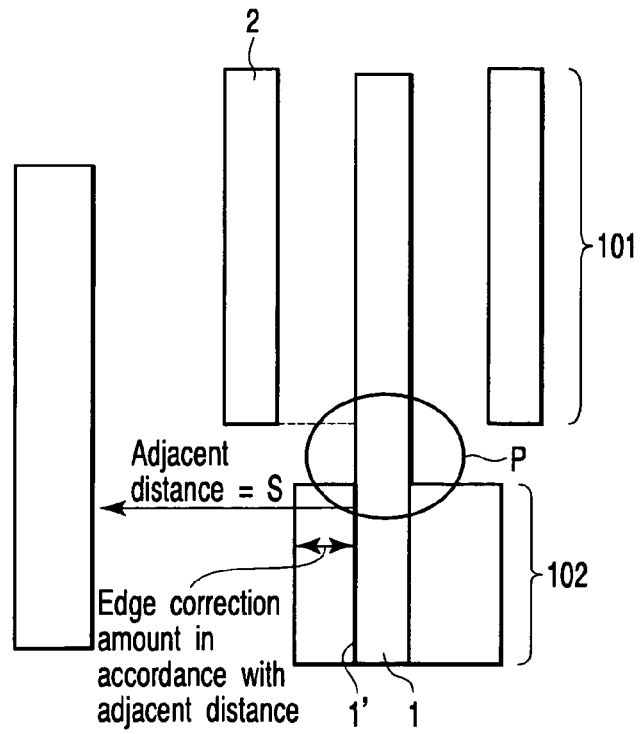
FIG. 14

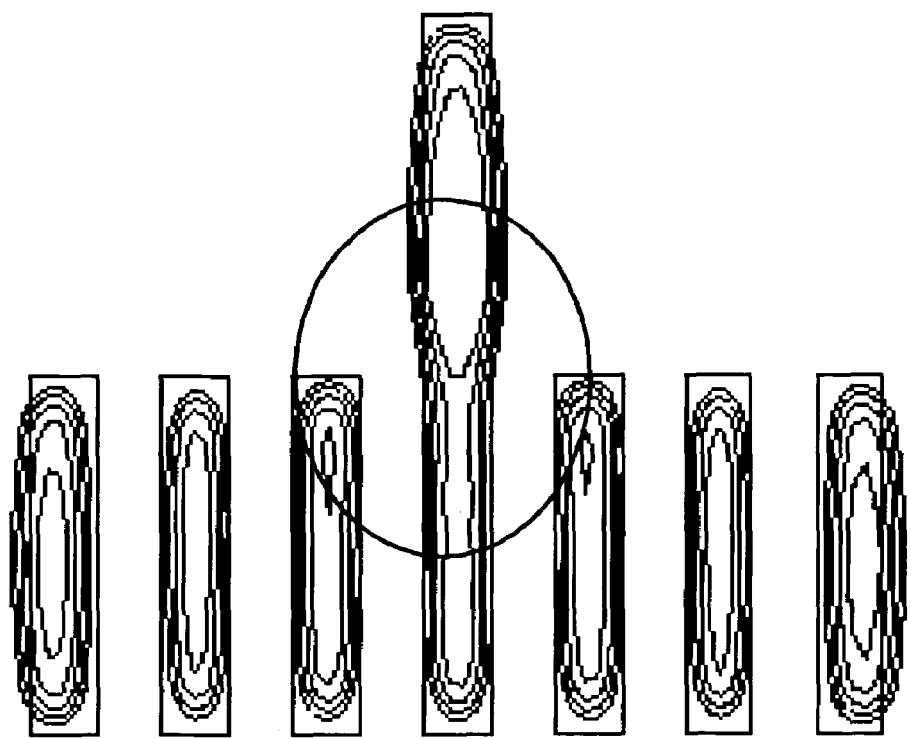
FIG. 13B Present embodiment
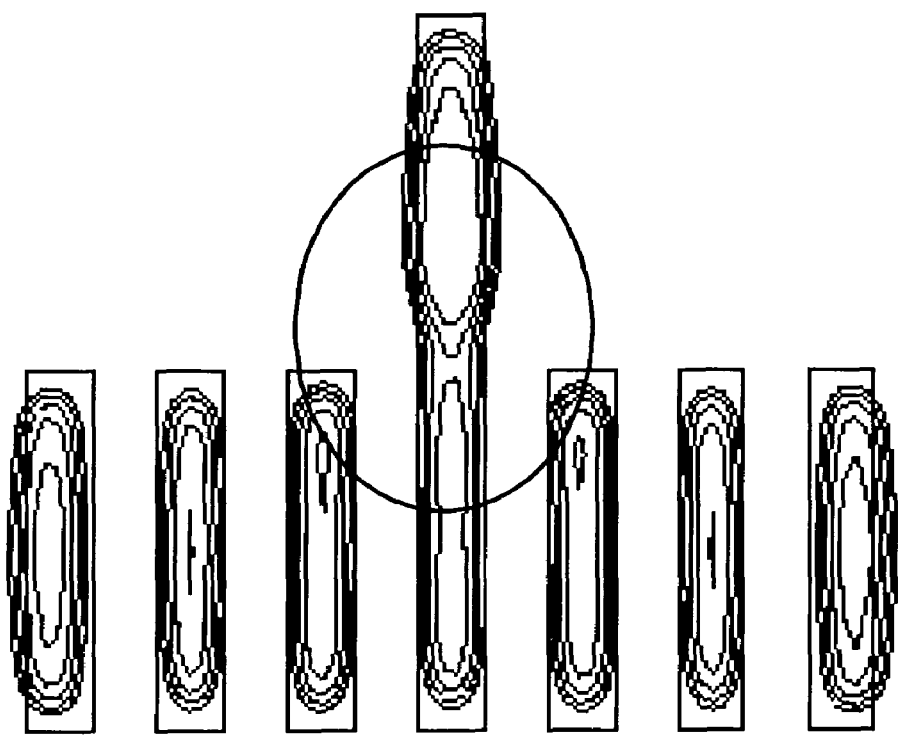
FIG. 13A Conventional method

US 7,458,057 B2

PATTERN CORRECTION METHOD, PATTERN CORRECTION SYSTEM, MASK MANUFACTURING METHOD, SEMICONDUCTOR DEVICE MANUFACTURING METHOD, RECORDING MEDIUM, AND DESIGNED PATTERN

CROSS-REFERENCE TO RELATED APPLICATIONS

This application is based upon and claims the benefit of priority from prior Japanese Patent Application No. 2003-190341, filed Jul. 2, 2003, the entire contents of which are incorporated herein by reference.

BACKGROUND OF THE INVENTION

1. Field of the Invention

The present invention relates to a pattern correction method, pattern correction system, mask manufacturing method, semiconductor device manufacturing method, recording medium, and designed pattern.

2. Description of the Background Art

In recent years, semiconductor manufacturing techniques have advanced very remarkably, and semiconductors having a minimum working size of 0.18 μm have been mass-produced. This miniaturization has been realized by rapid progresses of minute pattern forming techniques such as a mask process technique, lithography process technique, and etching process technique.

In an era when pattern sizes have been sufficiently large, a mask pattern having the same shape as that of a pattern drawn by a designer has been prepared, and transferred onto a resist applied on a wafer by an exposure apparatus, so that it has been possible to form the pattern as designed.

However, with miniaturization of the pattern sizes, the sizes of the patterns on the wafers have been largely influenced by diffraction of exposure light, and the process techniques of the masks and wafers for forming the minute patterns with good precision have been complicated. Therefore, even with the use of the mask having the same pattern as the designed pattern, it has been difficult to form the pattern as designed on the wafer.

To enhance fidelity of the designed pattern, techniques referred to as optical proximity correction (OPC) and process proximity correction (PPC) have been used in preparing a mask pattern for forming the same pattern as the designed pattern on the wafer.

There are roughly two methods in the OPC or PPC technique (hereinafter referred to as the PPC, including the OPC). In a first method, a movement amount of an edge constituting a designed pattern is defined as a rule in accordance with a width of the pattern, or a distance between patterns closest to each other, and the edge is moved in accordance with the rule. In a second method, the edge movement amount is driven into an optimum amount using a lithography simulator capable of predicting a diffracted light intensity distribution of the exposure light with high precision, so that the same pattern as the designed pattern can be formed on the wafer. Furthermore, a correction method has also been proposed in which these two methods are combined to realize the correction with higher precision.

Furthermore, in recent years, not only the method for correcting the mask pattern but also a technique (hereinafter referred to as the target MDP processing) in which the designed pattern drawn by a designer is also corrected in accordance with a certain rule have been proposed. This is developed for a purpose of facilitating the forming of specific pattern species on the wafer by the correction of the pattern species in a case where it is predicted to be difficult to form the specific pattern species on the wafer.

In this method, since the designed pattern itself is different from an original pattern drawn by the designer, it is necessary to proceed with the method after agreement with the designer on a way to change the pattern. However, in recent years, it has been especially difficult to secure a process margin in a lithography process, and therefore there has been a demand for a technique for changing the designed pattern in a more complicated manner.

It is to be noted that in a mask pattern correction method described in Jpn. Pat. Appln. KOKAI Publication No. 2002-131882, a pattern which can be manufactured in accordance with a design rule but whose size fluctuates largely by fluctuations of an exposure amount in a light exposure step and a focal distance is processed.

FIG. 14 is a diagram showing the target MDP processing according to a conventional example. In the correction rule of the conventional target MDP processing, as shown in FIG. 14, first a correction value is defined in accordance with a space width between the patterns. Here, a distance S between adjacent patterns is classified into S1, S2, S3, and S1<S2<S3 is set. In this case, assuming that the correction value in the target MDP processing at a time when the distance S satisfies S1<S≦S2 is a, and the correction value in the target MDP processing at a time when the distance S satisfies S2<S≦S3 is b, a, b generally satisfy a relation of a<b. That is, an isolated pattern having a broad space to the adjacent pattern can be more easily formed on the wafer, when the pattern is thickened beforehand.

Therefore, a correction value (edge movement value) which is larger than that of a congested pattern 101 present in the vicinity of an isolated pattern 102(1) is added to an edge 1' (shown by a bold line) of the isolated pattern to thicken the pattern. Thereafter, the mask pattern is further corrected by the PPC in such a manner that the same shape as that of the designed pattern can be formed on the wafer, and a finished pattern is formed on the wafer. Since process conditions for resolution of the patterns congested in this manner are usually determined with respect to the congested pattern 101, the target MDP processing is not required.

In this case, a portion surrounded by a circle p has an intermediate pattern between the congested pattern 101 and the isolated pattern 102. Since the congested pattern 101 exists in the vicinity of the intermediate pattern, the intermediate pattern is regarded as a congested pattern, and any correction value is not added to the intermediate pattern. If the intermediate pattern is regarded as the isolated pattern, the same correction as that of the edge 1' present in the vicinity of the intermediate pattern is performed, therefore a very large correction value is added, and a distance between the intermediate pattern and an adjacent pattern 2 becomes very short.

As a result, in the conventional target MDP processing, it is difficult to secure a sufficient lithography margin in the intermediate portion between the congested pattern and the isolated pattern, and this sometimes causes an open-circuit/short-circuit on the wafer.

BRIEF SUMMARY OF THE INVENTION

According to an aspect of the invention, there is provided a pattern correction method in which a shape of a target pattern is corrected in accordance with an arrangement state between the target pattern configuring a designed pattern and a vicinity pattern disposed in the vicinity of the target pattern, the pattern correction method comprising: detecting a first arrangement state between a first predetermined portion of an edge of the target pattern and the vicinity pattern; detecting a second arrangement state between a second predetermined portion of the edge of the target pattern and the vicinity pattern; determining a correction value of the edge of the target pattern based on a rule in accordance with the first and second arrangement states; and adding the correction value to the edge of the target pattern.

According to another aspect of the invention, there is provided a computer readable recording medium in which a program is recorded, the program which allows a computer to: detect a first arrangement state between a first predetermined portion of an edge of a target pattern configuring a designed pattern and a vicinity pattern disposed in the vicinity of the target pattern; detect a second arrangement state between a second predetermined portion of the edge of the target pattern and the vicinity pattern; determine a correction value of the edge of the target pattern based on a rule in accordance with the first and second arrangement states; and add the correction value to the edge of the target pattern.

According to another aspect of the invention, there is provided a designed pattern in which a target pattern has two or more steps in a portion where arrangement of a pattern in the vicinity of the target pattern changes.

BRIEF DESCRIPTION OF THE SEVERAL VIEWS OF THE DRAWING

FIGS. 8A, 8B, 8C are diagrams showing designed patterns by a conventional method and a method of the embodiment of the present invention;

FIGS. 9A, 9B, 9C are diagrams showing designed patterns by the conventional method and the method of the embodiment of the present invention;

FIGS. 11A, 11B are diagrams showing designed patterns by the conventional method and the method of the embodiment of the present invention;

FIGS. 13A, 13B are diagrams showing results in a case where a focal position is also varied together with an exposure amount with respect to FIGS. 12A, 12B; and FIG. 14 is a diagram showing the target MDP processing according to a conventional example.

DETAILED DESCRIPTION OF THE INVENTION

An embodiment of the present invention will be described hereinafter with reference to the drawings.

Figure 1A:
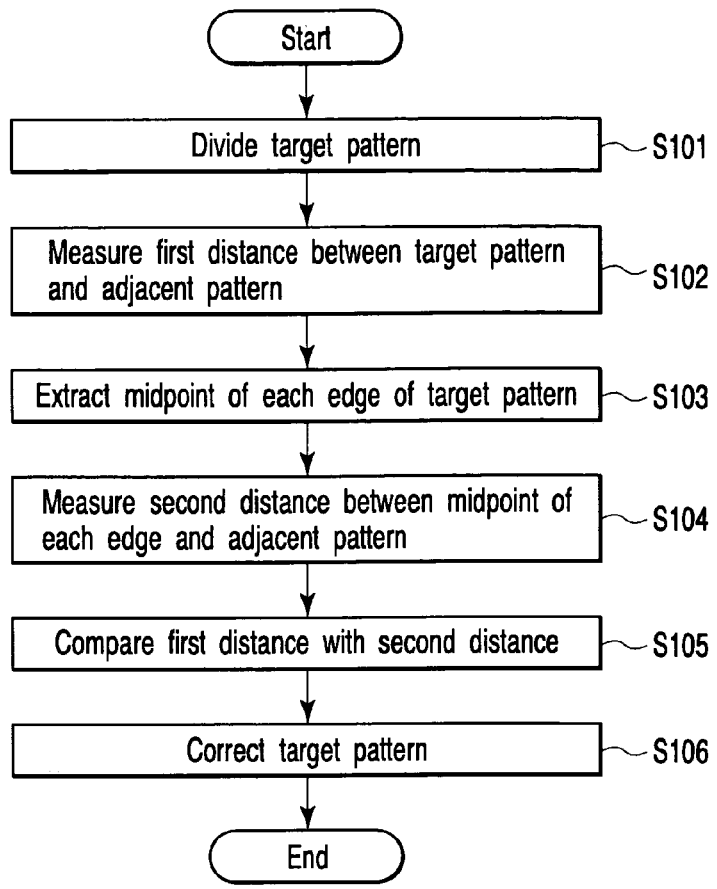
FIG. 1A is a flowchart of target MDP processing in a pattern correction method according to an embodiment of the present invention.
Figure 1B:
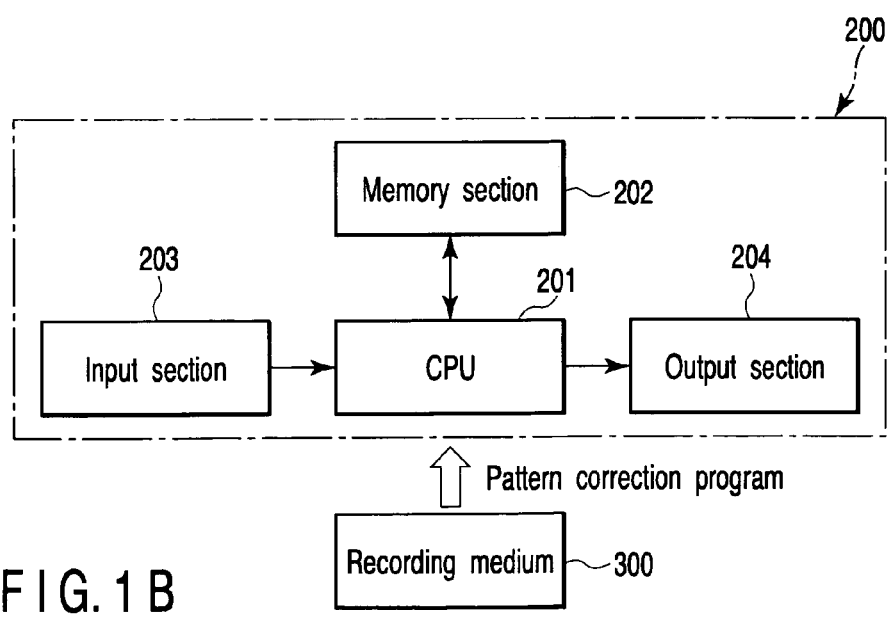
FIG. 1B is a diagram showing a configuration of a pattern correction system according to the embodiment of the present invention.

FIG. 1A is a flowchart of target MDP processing in a pattern correction method according to the embodiment of the present invention. FIG. 1B is a diagram showing a configuration of a pattern correction system in which the present target MDP processing is performed. FIGS. 2 to 6 are diagrams showing designed patterns to be subjected to the present target MDP processing. A procedure of the present target MDP processing will be described hereinafter with reference to FIGS. 1A, 1B, 2 to 6. The present target MDP processing is performed, when a CPU 201 of a computer 200 of FIG. 1B reads a pattern correction program recorded in a recording medium 300 (CD-ROM, etc.) into a memory section 202 (RAM) to execute the program. It is to be noted that the computer 200 includes an input section 203 and an output section 204 in addition to the CPU 201 and the memory section 202.

Figure 2:
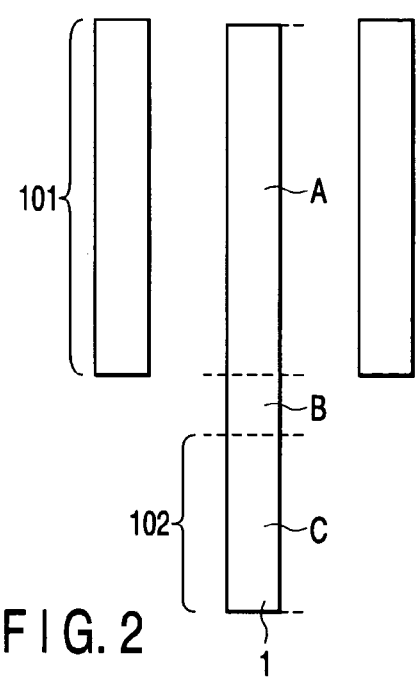
FIG. 2 is a diagram showing a designed pattern to be subjected to the target MDP processing according to the embodiment of the present invention.

First in step S101, as shown in FIG. 2, a pattern which is a processing target is divided. A designed pattern shown in FIG. 2 includes a congested pattern 101 and an isolated pattern 102. Then, one pattern 1 of the processing target is divided into a portion A included in the congested pattern 101, a portion C constituting the isolated pattern 102, and an intermediate portion B.

Figure 3:
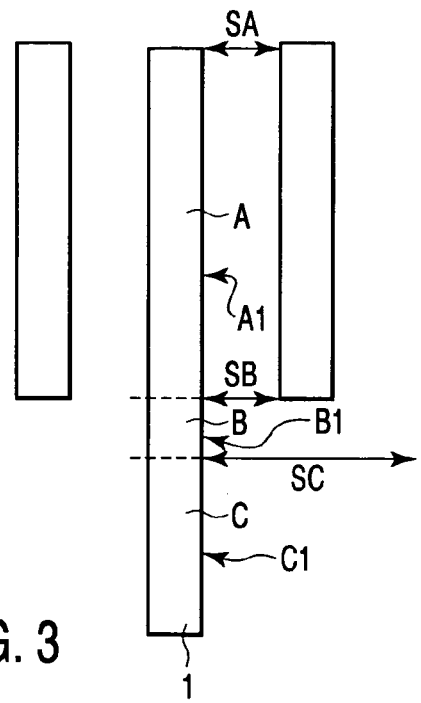
FIG. 3 is a diagram showing a designed pattern to be subjected to the target MDP processing according to the embodiment of the present invention.

In step S102, as shown in FIG. 3, first distances SA, SB, SC between end portions of edges A1, B1, C1 of the respective portions A, B, C in the pattern 1 and patterns disposed in the vicinity of (adjacent to) the edges (the pattern in the vicinity of the edge C1 is not shown) are measured. It is to be noted that the respective patterns exist in a direction crossing the edges A1, B1, C1 of the pattern 1 at right angles.

Figure 4:
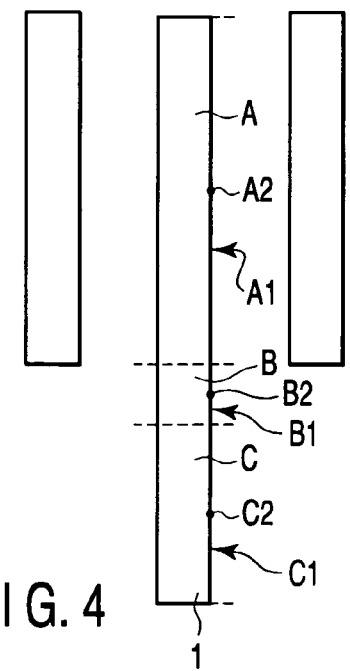
FIG. 4 is a diagram showing a designed pattern to be subjected to the target MDP processing according to the embodiment of the present invention.
Figure 5:
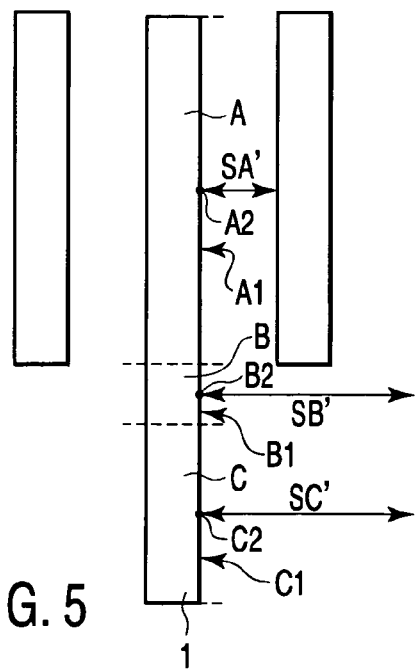
FIG. 5 is a diagram showing a designed pattern to be subjected to the target MDP processing according to the embodiment of the present invention.

In step S103, as shown in FIG. 4, midpoints A2, B2, C2 of the respective edges A1, B1, C1 are extracted. In step S104, as shown in FIG. 5, second distances SA', SB', SC' between the respective midpoints A2, B2, C2 of the edges A1, B1, C1 and the patterns disposed in the vicinity of the edges (the patterns in the vicinity of the edges B1, C1 are not shown) are measured.

In step S105, the first distances SA, SB, SC are compared with the second distances SA', SB', SC'. Judgments SA=SA', SB<SB', SC=SC' are obtained from FIGS. 3, 5.

In step S106, the pattern 1 is corrected. In a first correction rule of the present target MDP processing, with respect to the edge in which the first distance is equal to the second distance as a result of the comparison of the step S105, a correction value is defined in accordance with the distance between the edge and the pattern in the vicinity of the edge. Here, a reference distance between the edge and the pattern in the vicinity of the edge is classified as S1, S2, S3, and S1<S2<S3 is set. In this case, the correction value is set to a, when an actual distance S between the edge and the pattern in the vicinity of the edge has a relation of S1<S≦S2. The correction value is set to b, when the actual distance S has a relation of S2<S≦S3.

In the present embodiment, since SA (SA')≦S1, the edge A1 is not corrected. Since S1<SC≦S2, the correction value a is applied to the edge C1.

Furthermore, in a second correction rule of the present target MDP processing, with respect to the edge in which the first distance<the second distance is judged as a result of the comparison of the step S105, a correction value is defined in accordance with the distance between the edge and the pattern in the vicinity of the edge. This correction value is smaller than that of the first correction rule. For example, the correction value is set to a/2, when the actual distance S between the edge and the pattern in the vicinity of the edge has a relation of S1<S≦S2. The correction value is set to b/2, when the actual distance S has a relation of S2<S≦S3.

In the present embodiment, S1<SB≦S2 is satisfied, and the correction value a/2 is applied to the edge B1.

Figure 6:
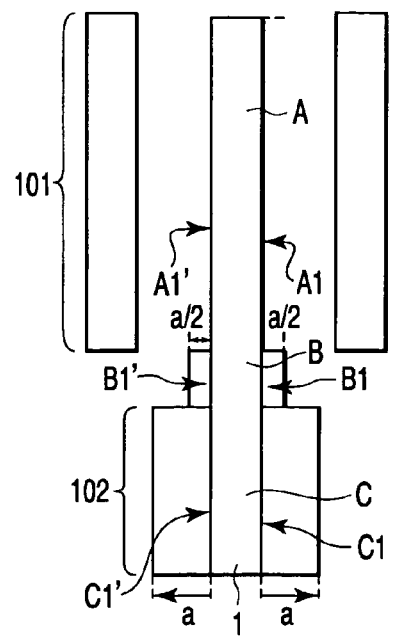
FIG. 6 is a diagram showing a designed pattern to be subjected to the target MDP processing according to the embodiment of the present invention.

As a result, as shown in FIG. 6, the correction value a is added to the edge C1 of the pattern 1, and the correction value a/2 is added to the edge B1.

It is to be noted that steps similar to the steps S101 to S106 are performed with respect to the other edges A1', B1', C1' of the pattern 1, the correction value a is added to the edge C1', and the correction value a/2 is added to the edge B1'. That is, the correction value a/2 is added to each of the edges B1, B1' of the intermediate portion B between the congested pattern 101 and the isolated pattern 102.

Accordingly, the intermediate portion between the congested pattern 101 and the isolated pattern 102 is appropriately corrected, and a designed pattern having stepped portions in the intermediate portion is obtained.

As described above, in the present embodiment, first the edge of the target pattern is divided, and the distance between the end portion (first predetermined portion) of each divided edge and the pattern disposed in the vicinity of the edge (first arrangement state between the target pattern and the vicinity pattern) is measured (detected). Moreover, the distance between the midpoint (second predetermined portion) of each edge and the pattern in the vicinity of the edge (second arrangement state between the target pattern and the vicinity pattern) is measured (detected).

In each of the edges A1 (A1'), C1 (C1'), the distance between the end portion and the pattern in the vicinity of the end portion is equal to that between the midpoint and the pattern in the vicinity of the midpoint. In this case, since there is a comparatively large space (SC) between the edge C1 (C1') and the pattern in the vicinity of the edge, the edge C1 (C1') is regarded as the edge of the isolated pattern, and the correction value a is applied in accordance with the first correction rule. Since the pattern disposed in the vicinity of the edge A1 (A1') exist in a position of the distance SA, the edge is regarded as that of the congested pattern, and any correction value is not applied. In this state, since a width of the portion B having the edge B1 (B1') is unchanged, and the pattern remains to be thin, it is difficult to secure a process margin.

In the edge B1 (B1'), the distance between the end portion and the vicinity pattern is different from that between the midpoint and the vicinity pattern. In this case, it is judged that the distance SB' between the midpoint of the edge B1 (B1') and the pattern in the vicinity of the edge is longer than the distance SB between the end portion and the vicinity pattern, and the second correction rule different from the first correction rule is applied. The correction value of the second correction rule is smaller than that of the first correction rule. By the application of the second correction rule, an appropriate correction value can also be added to the edge B1 (B1') to which the correction value has not been added in the first correction.

According to the method, even the edge which has not heretofore been corrected and whose process margin has not been sufficiently secured can be corrected, and the process margin is largely enhanced.

Figure 7:
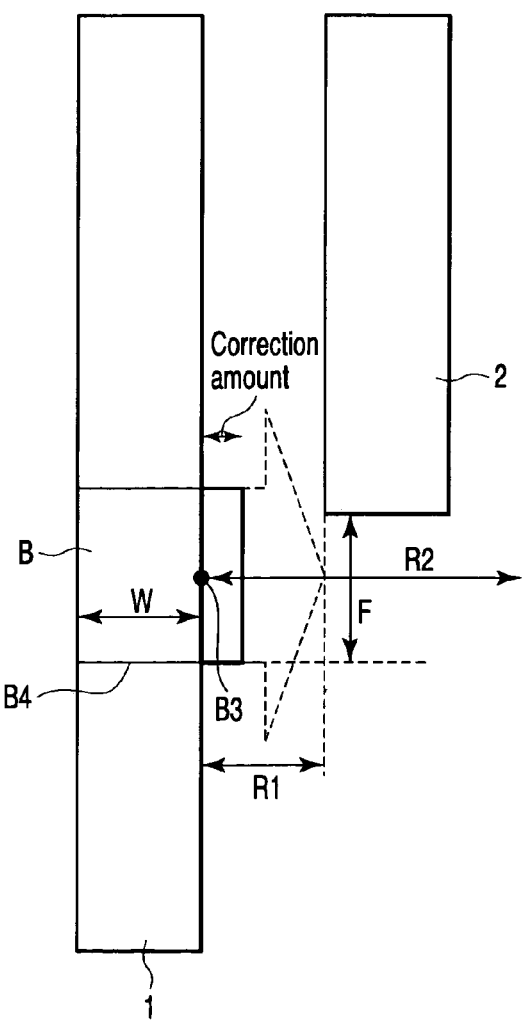
FIG. 7 is a diagram showing a designed pattern to be subjected to the target MDP processing to which a second correction rule is applied according to the embodiment of the present invention.

FIG. 7 is a diagram showing a designed pattern in a case where the second correction rule is applied to perform the above-described target MDP processing. The following table is an example of a correction table which can be used in the second correction rule.

TABLE 1

| W | R1 | R2 | Correction amount (nm) |
|---|---|---|---|
| 0 ≦ W < 100 | 0 ≦ R1 < 100 | 0 ≦ R2 < 100 | 0 |
| 0 ≦ W < 100 | 0 ≦ R1 < 100 | 100 ≦ R2 < 1000 | +10 |
| 0 ≦ W < 100 | 100 ≦ R1 < 200 | any | +15 |
| 0 ≦ W < 100 | 200 ≦ R1 < 500 | any | +20 |
| 0 ≦ W < 100 | 500 ≦ R1 | any | +30 |
| 100 ≦ W < 200 | 0 ≦ R1 < 100 | 0 ≦ R2 < 100 | 0 |
| 100 ≦ W < 200 | 0 ≦ R1 < 100 | 100 ≦ R2 < 1000 | +5 |
| 100 ≦ W < 200 | 100 ≦ R1 < 200 | any | +10 |
| 100 ≦ W < 200 | 200 ≦ R1 < 500 | any | +15 |
| 100 ≦ W < 200 | 500 ≦ R1 | any | +20 |

In FIG. 7, it is assumed that a linear width of the intermediate portion B between the congested pattern and the isolated pattern in the pattern 1 constituting the target is W, a distance between the whole edge of the pattern 1 and the vicinity pattern 2 is R1, a distance between a specific point (point in the vicinity of the midpoint of the edge) on the edge of the portion B and the pattern in the vicinity (not shown) is R2, and a distance between the closest pattern 2 and an extended line of a dividing line B4 of the portion B is F. When F=150 nm, the correction value (correction amount) can be determined in accordance with the above table in the second correction rule.

FIGS. 8A, 8B, 8C are diagrams showing designed patterns by a conventional method and a method of the embodiment of the present invention. In each figure, a portion to be corrected is surrounded by a circle. In FIG. 8B, the designed pattern before correction, shown in FIG. 8A, is corrected by the conventional target MDP processing, and one step is disposed on a target pattern 11. On the other hand, in FIG. 8C, the designed pattern before correction, shown in FIG. 8A, is corrected by the target MDP processing of the embodiment of the present invention, and two steps are disposed on the target pattern.

FIGS. 9A, 9B, 9C are diagrams showing designed patterns by the conventional method and the method of the embodiment of the present invention. In each figure, a portion to be corrected is surrounded by a circle. In FIG. 9B, the designed pattern before correction, shown in FIG. 9A, is corrected by the conventional target MDP processing, and one step is disposed on the target pattern 11. On the other hand, in FIG. 9C, the designed pattern before correction, shown in FIG. 9A, is corrected by the target MDP processing of the embodiment of the present invention, and two steps are disposed on the target pattern.

Figure 10C:
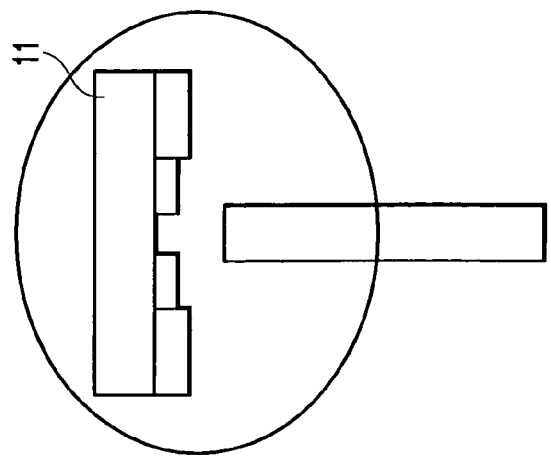
FIGS. 10A, 10B, 10C are diagrams showing designed patterns by the conventional method and the method of the embodiment of the present invention.
Figure 10B:
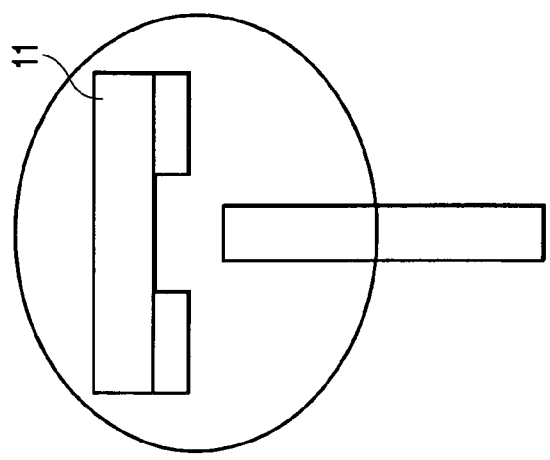
Figure 10A:
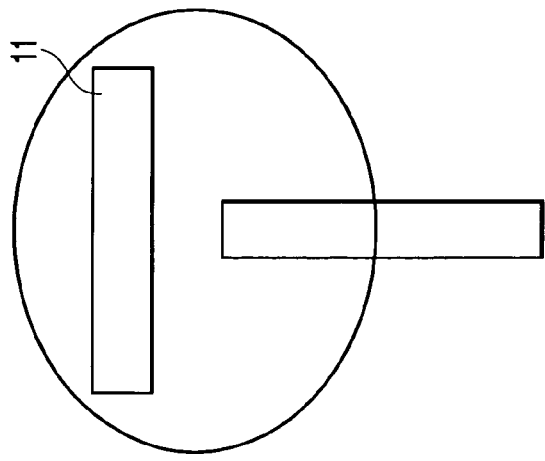

FIGS. 10A, 10B, 10C are diagrams showing designed patterns by the conventional method and the method of the embodiment of the present invention. In each figure, a portion to be corrected is surrounded by a circle. In FIG. 10B, the designed pattern before correction, shown in FIG. 10A, is corrected by the conventional target MDP processing, and one step is disposed on the target pattern 11. On the other hand, in FIG. 10C, the designed pattern before correction, shown in FIG. 10A, is corrected by the target MDP processing of the embodiment of the present invention, and two steps are disposed on the target pattern.

FIG. 11A is a diagram showing the designed pattern prepared by the conventional method, and FIG. 11B is a diagram showing the designed pattern prepared by the method of the embodiment of the present invention. As compared with FIG. 11A, in the method of the embodiment of the present invention, as shown in FIG. 11B, a designed pattern can be prepared in which the target pattern 11 has two or more steps in a portion where peripheral environment (vicinity pattern) changes. Therefore, according to the embodiment of the present invention, a designed pattern shape in which a process margin is enhanced can be formed.

Figure 12B:
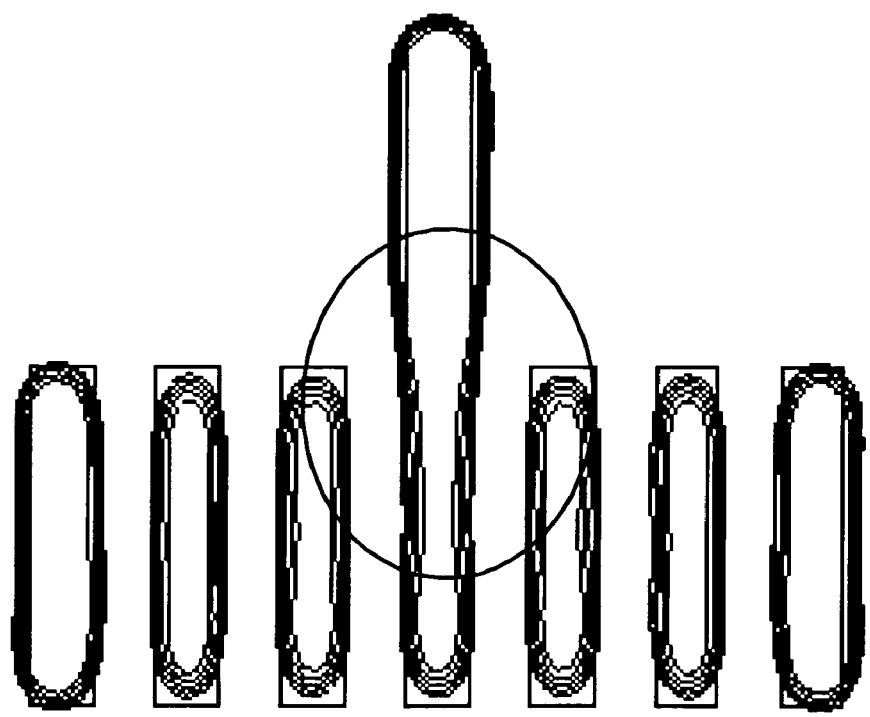
FIGS. 12A, 12B are diagrams showing results in a case where optical proximity correction is performed, a mask pattern is prepared, and the mask pattern is exposed on a wafer with respect to the designed patterns by the conventional method and the method of the embodiment of the present invention.
Figure 12A:
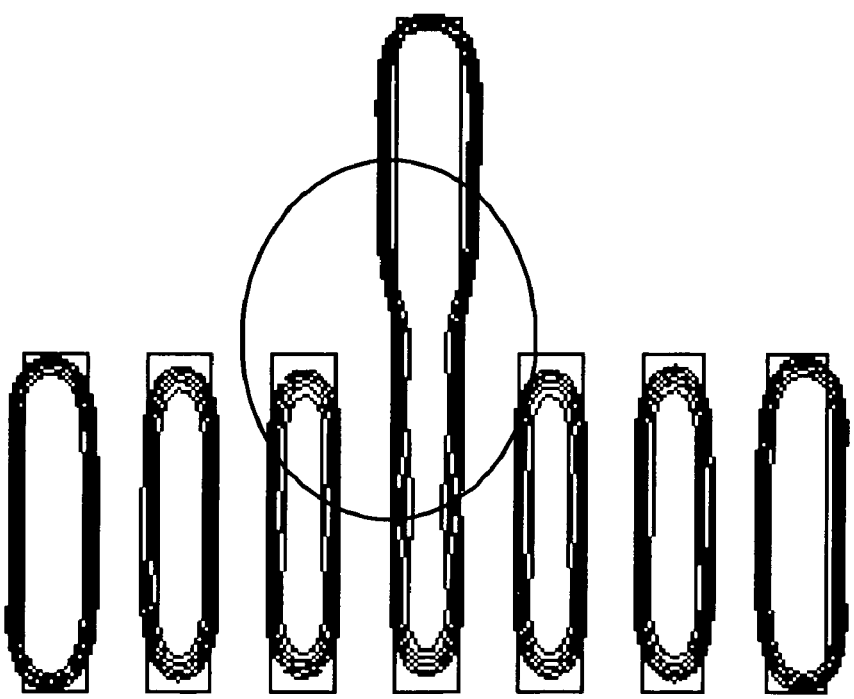

FIGS. 12A, 12B are diagrams showing results in a case where optical proximity correction is performed, a mask pattern is prepared, and the mask pattern is exposed on a wafer with respect to the designed patterns shown in FIGS. 11A, 11B. It is to be noted that the optical proximity correction is determined in such a manner that the shape of the designed pattern shown in FIG. 1B matches that of the pattern formed on the wafer by the mask pattern.

In FIGS. 12A, 12B, it is assumed that a focus of an exposure device is optimum (best focus), and a finished plane shape in a case where the exposure amount applied from the exposure device has an optimum value (best dose) is superposed/shown upon that in a case where the exposure amount changes from the optimum value by ±10%. Portions surrounded by circles are to be noted, and it is seen that the finished shape of the portion gently changes in the method of the embodiment of the present invention shown in FIG. 12B as compared with FIG. 12A.

FIGS. 13A, 13B are diagrams showing results in a case where a focal position is also varied together with an exposure amount with respect to FIGS. 12A, 12B, respectively. The portions surrounded by circles are to be noted. When the patterns are compared with each other at the equal exposure amount, the pattern is disconnected in the conventional method shown in FIG. 12A, whereas the pattern is not disconnected in the embodiment of the present invention shown in FIG. 12B. An effect of enhancement of the process margin by the embodiment of the present invention is evident.

In this manner, in the method according to the embodiment of the present invention, the designed pattern is prepared, a dimension conversion difference of the designed pattern caused by a wafer process including the optical proximity correction is corrected, if necessary, to prepare the mask pattern, and the pattern is exposed on the wafer. It has been proved that a process margin larger than that of the conventional method can be secured by the present embodiment.

It is to be noted that the pattern correction system can be constructed by the computer which carries out the pattern correction method of the present embodiment. A mask can be manufactured by the designed pattern corrected by the pattern correction method of the present embodiment. A semiconductor device can be manufactured using the mask.

As described above, according to the present embodiment, the rule is prepared to define the correction amount (movement amount) of the edge of the target pattern in accordance with the distance between the edge constituting the target pattern and that of the adjacent pattern or the width of the target pattern, and the edge of the target pattern is corrected based on the rule. That is, the edge correction amount which differs in accordance with a minimum distance between the edge end portion of the target pattern and the edge of the adjacent pattern and that between the edge central portion of the target pattern and the edge of the adjacent pattern is ruled based on the minimum distances. This can realize the pattern correction which has not heretofore been realized in the conventional method. As a result, the process margin of lithography or the like can be largely enhanced, and yield of the semiconductor device can be largely enhanced.

According to the embodiment of the present invention, there can be provided a pattern correction method in which the intermediate portion between the congested pattern and the isolated pattern is appropriately corrected, a pattern correction system, and a recording medium.

Moreover, according to the embodiment of the present invention, there can be provided a method of manufacturing the mask or the semiconductor device using the designed pattern in which the intermediate portion between the congested pattern and the isolated pattern is appropriately corrected.

Furthermore, according to the embodiment of the present invention, there can be provided a designed pattern in which the intermediate portion between the congested pattern and the isolated pattern is appropriately corrected.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A pattern correction method in which a shape of a target pattern is corrected in accordance with an arrangement state between the target pattern configuring a designed pattern and a vicinity pattern disposed in the vicinity of the target pattern, the pattern correction method comprising:
   detecting a first arrangement state between a first predetermined portion of an edge of the target pattern and the vicinity pattern;
   detecting a second arrangement state between a second predetermined portion of the edge of the target pattern and the vicinity pattern;
   determining a correction value of the edge of the target pattern based on a rule in accordance with the first and second arrangement states; and
   adding the correction value to the edge of the target pattern, wherein:
   the first and second arrangement states are indicated by a distance between the edge of the target pattern and the edge of the vicinity pattern existing in a direction crossing the edge of the target pattern at right angles; and
   determining the correction value is performed by determining a first correction value in a case where the first arrangement state is equal to the second arrangement state, and determining a second correction value in a case where the second arrangement state is larger than the first arrangement state, and the second correction value is smaller than the first correction value.

2. The pattern correction method according to claim 1, wherein the determining of the correction value is performed by determining the correction value of the edge of the target pattern based on two rules in accordance with results of comparison of the first arrangement state with the second arrangement state.

3. The pattern correction method according to claim 1, further comprising: determining a mask pattern by optical proximity correction, after adding the correction value.

4. The pattern correction method according to claim 2, further comprising: determining a mask pattern by optical proximity correction, after adding the correction value.

5. The pattern correction method according to claim 3, further comprising: determining the optical proximity correction in such a manner that a shape of the designed pattern to which the correction value has been added matches that of a pattern formed on a wafer by the mask pattern.

6. The pattern correction method according to claim 4, further comprising: determining the optical proximity correction in such a manner that a shape of the designed pattern to which the correction value has been added matches that of a pattern formed on a wafer by the mask pattern.

7. A pattern correction system which corrects a designed pattern by the pattern correction method according to claim 1.

8. A pattern correction system which corrects a designed pattern by the pattern correction method according to claim 2.

9. A method of manufacturing a mask by use of a designed pattern corrected by the pattern correction method according to claim 1.

10. A method of manufacturing a mask by use of a designed pattern corrected by the pattern correction method according to claim 2.

11. A method of manufacturing a semiconductor device by use of a mask manufactured by the method of manufacturing the mask according to claim 9.

12. A computer readable recording medium in which a program is recorded, the program which allows a computer to:
- detect a first arrangement state between a first predetermined portion of an edge of a target pattern configuring a designed pattern and a vicinity pattern disposed in the vicinity of the target pattern;
- detect a second arrangement state between a second predetermined portion of the edge of the target pattern and the vicinity pattern;
- determine a correction value of the edge of the target pattern based on a rule in accordance with the first and second arrangement states; and
- add the correction value to the edge of the target pattern, wherein:
the first and second arrangement states are indicated by a distance between the edge of the target pattern and the edge of the vicinity pattern existing in a direction crossing the edge of the target pattern at right angles; and
the correction value is determined by performed by determining a first correction value in a case where the first arrangement state is equal to the second arrangement state, and determining a second correction value in a case where the second arrangement state is larger than the first arrangement state, and the second correction value is smaller than the first correction value.

* * * * *